United States Patent [19]
Fant et al.

[11] Patent Number: 5,977,663
[45] Date of Patent: Nov. 2, 1999

[54] DYNAMIC THRESHOLD GATES WITH EMBEDDED REGISTRATION

[75] Inventors: Karl M. Fant, Minneapolis; David A. Parker, St. Paul, both of Minn.

[73] Assignee: Theseus Logic, Inc., Orlando, Fla.

[21] Appl. No.: 08/936,130

[22] Filed: Sep. 24, 1997

[51] Int. Cl.⁶ ................................................. G06K 07/10
[52] U.S. Cl. .................................... 307/251; 235/462.24
[58] Field of Search .................................... 307/251, 211, 307/490, 452; 235/441, 462.01, 462.24, 462.25, 462.26

[56] References Cited

U.S. PATENT DOCUMENTS

| | | | |
|---|---|---|---|
| 3,449,594 | 6/1969 | Gibson et al. | 307/251 |
| 3,519,941 | 7/1970 | Winder | 307/211 |
| 3,715,603 | 2/1973 | Lerch . | |
| 4,710,650 | 12/1987 | Shorji | 307/452 |
| 4,845,633 | 7/1989 | Furtek | 364/490 |
| 5,121,003 | 6/1992 | Williams . | |
| 5,305,463 | 4/1994 | Fant et al. . | |
| 5,382,844 | 1/1995 | Knauer . | |

OTHER PUBLICATIONS

Anantharaman, "A delay insensitive regular expression recognizer," research paper, Dept. of Computer Science, Carnegie–Mellon University, pp. 1–10 (Jan., 1989).

Brzozowski et al., "Asynchronous Circuits," Table of Contents, 20 pgs. (1995).

Burford et al., "An 180 Mhz 16 bit Multiplier Using Asynchronous Logic Design Techniques," *IEEE 1994 Custom Integrated Circuits Conference*, pp. 215–218 (1994).

(List continued on next page.)

*Primary Examiner*—Thien Le
*Attorney, Agent, or Firm*—Staas & Johnson LLP

[57] ABSTRACT

A threshold gate with registration embedded in the threshold logic is disclosed. A go-to-NULL network and a go to-data network receives data input having an asserted state and a NULL state. A directive or acknowledge signal is received by the embedded registrations network. The directive signal indicates whether an asserted state or the NULL state is desired at the output signal line. A data processing network is coupled to the go-to-NULL network to provide an output signal based upon the go-to-NULL network, the go-to-data network and the registration network. The go-to-data network provides a network of switches that cause an asserted state at the output signal line when a number of the data inputs in the asserted state exceeds a predetermined threshold and the acknowledge signal is in the asserted state. The go-to-NULL network provides a network of switches that cause a NULL state at the output signal line when all of the data inputs are in the NULL state and the acknowledge signal is in the NULL state. A reset network is included for providing system initialization at registration boundaries. The reset network is made transparent during normal operating conditions.

28 Claims, 7 Drawing Sheets

OTHER PUBLICATIONS

Dean, "Strip: A Self–Timed Risk Processor," Dissertation, *STRiP's Implementation,* Computer Systems Laboratory, Stanford University, pp. 108–114 and 145–147 (Jul. 1992).

Greenstreet et al., "Self–Timed Iteration," *Elsevier Science Publishers B.V. (North–Holland),* pp. 309–322 (1988).

Hampel et al., "Threshold logic," *IEEE Spectrum,* pp. 32–39 (May 1971).

Heller et al., "Session I: Custom and Semi–Custom Design Techniques—WAM 1.3: Cascode Voltage Switch Logic: A Differential CMOS Logic Family," *IEEE International Solid State Circuit Conference,* 2 pgs. (1984).

Mead et al., "Introduction to VLSI Systems," *Addison–Wesley Series in Computer Science,* pp. 242–262 (1980).

Meng et al., "Automatic Synthesis of Asynchronous Circuits from High–Level Specifications," *IEEE Transactions on Computer–Aided Design,* vol. 8, No. 11, pp. 1185–1205 (Nov. 1989).

Muller, "Asynchronous Logics and Application to Information Processing," *Switching Theory in Space Technology,* pp. 289–297 (1963).

Nielsen et al., "A Low–power Asynchronous Data–path for a FIR filter bank," *IEEE,* pp. 197–207 (1996).

Renaudin et al., "The Design of Fast Asynchronous Adder Structures and their Implementation using D.C.V.S. Logic," *International Symposium on Circuits and Systems,* vol. 4, pp. 291–294 (undated).

Shibata et al., "A Functional MOS Transistor Featuring Gate–Level Weighted Sum and Threshold Operations," *IEEE Transactions on Electron Devices,* vol. 39, No. 6, pp. 1444–1455 (Jun. 1992).

Singh, "A Design Methodology for Self–Timed Systems," Thesis, *Massachusetts Institute of Technology,* pp. 1–98 (Feb. 1981).

Sparso et al., "Design of delay insensitive circuits using multi–ring structures," EURO–DAC '92 European Design Automation Conference, *IEEE,* pp. 15–20 (1992).

Sparso et al., "Delay–insensitive multi–ring structures," *Integration, the VLSI journal 15,* pp. 313–340 (1993).

Sutherland, "Micropipelines," *Communications of the ACM,* vol. 32, No. 6, pp. 720–738 (Jun. 1989).

Unger, "Asynchronous Sequential Switching Circuits," Chapter 6, *Department of Electrical Engineering, Columbia University,* pp. 221–229 (1969).

Williams, "Latency and Throughput Tradeoffs in SelfTimed Speed–Independent Pipelines and Rings," *Technical Report No. CSL–TR–90–431, Computer Systems Laboratory, Stanford University,* pp. 1–26 (Aug. 1990).

Williams, "Self–Timed Rings and their Application to Division/Chapters 1–7," *Technical Report No. CSL–TR–91–482, Computer Systems Laboratory, Stanford University,* pp. 1–144 (May 1991).

Wojcik et al., "On the Design of Three–Valued Asynchronous Modules," *IEEE Transactions on Computers,* vol. C–29, No. 10, pp. 889–898 (Oct. 1980).

Wuu et al., "Transaction Briefs—A Design of a Fast and Area Efficient Multi–Input Muller C–element," *IEEE Transactions on Very Large Scale Integration (VLSI) Systems,* vol. 1, No. 2, pp. 215–219 (Jun. 1993).

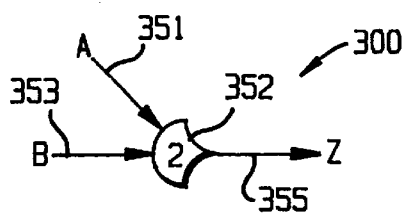
FIG.3a
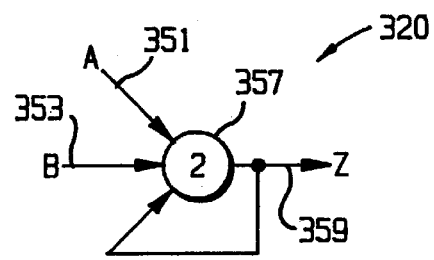
FIG.3b
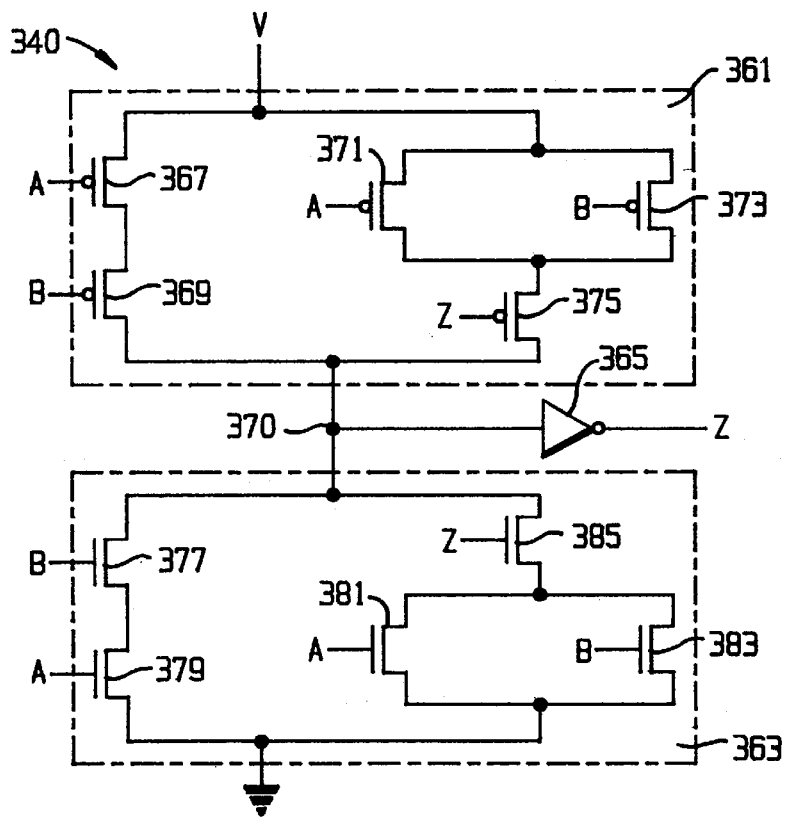
FIG.3c
FIG.14
| REGISTRATION TYPE | PROCESSING THROUGHPUT |
|---|---|
| 1410 — DISCRETE REGISTRATION | 1.48 ns |
| 1412 — EMBEDDED REGISTRATION | 1.26 ns |

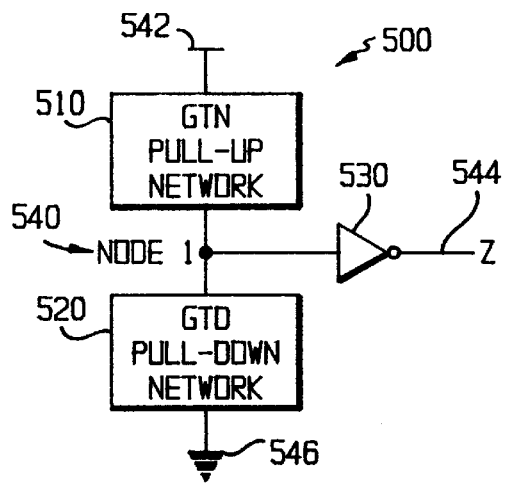
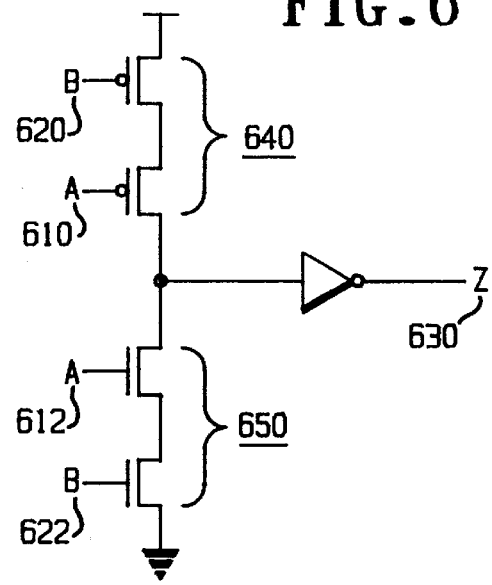
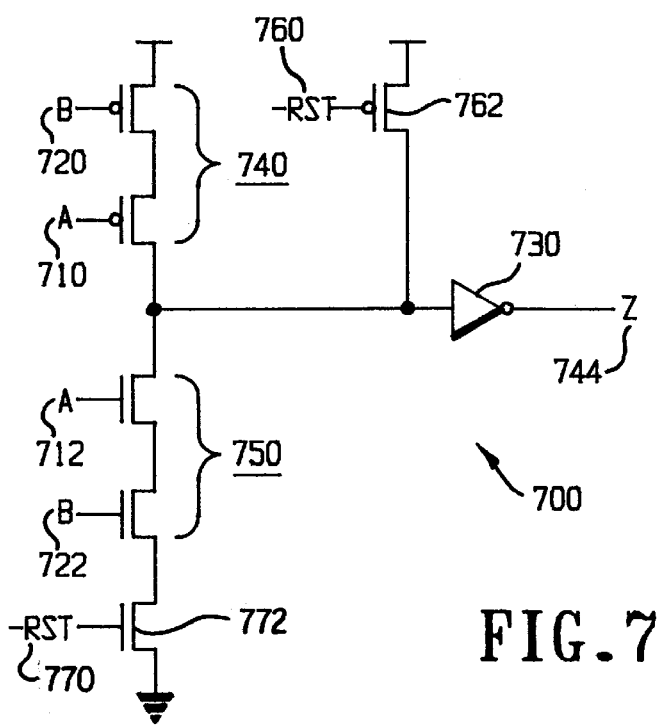
FIG. 5
FIG. 6
FIG. 7

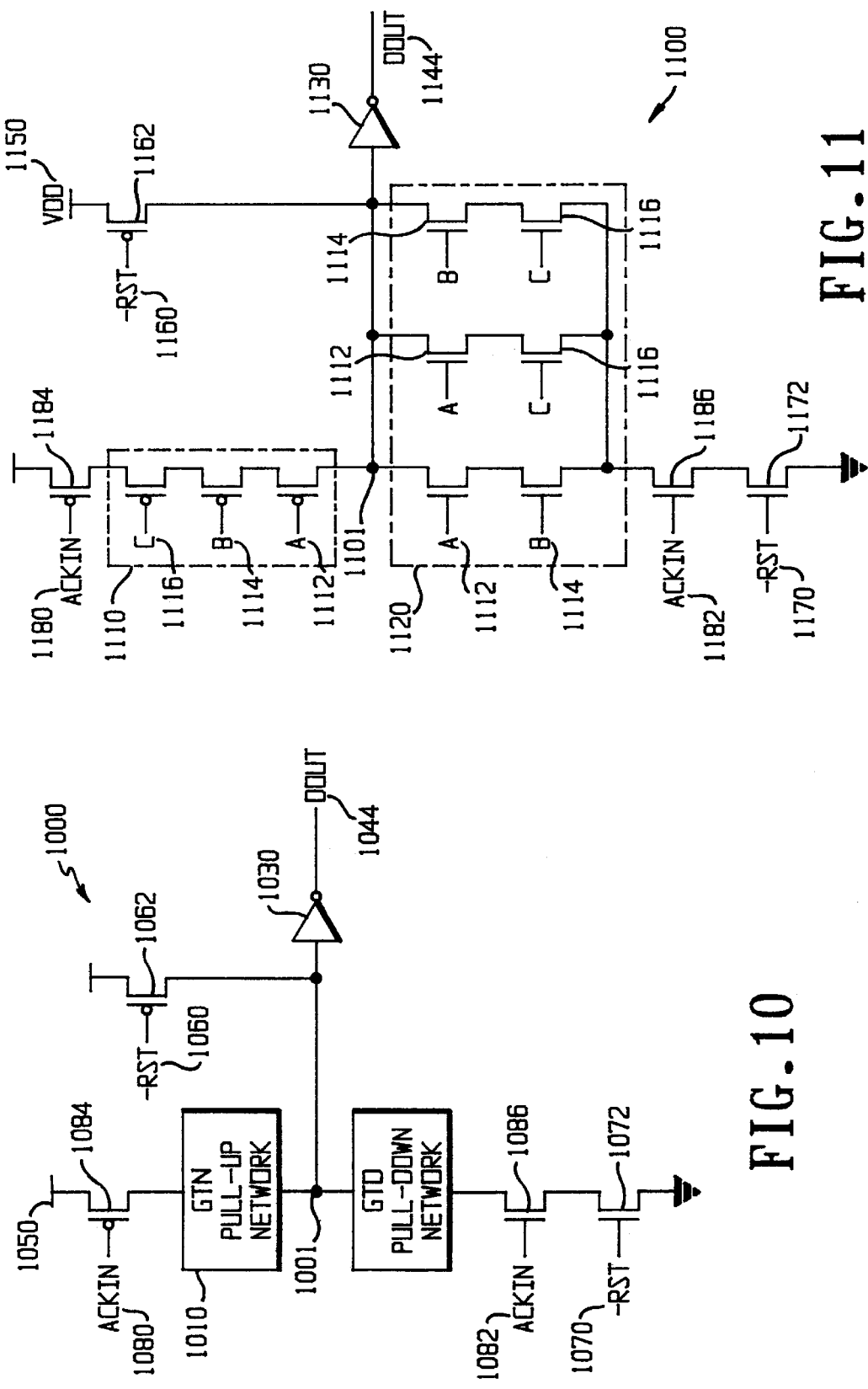

DYNAMIC THRESHOLD GATES WITH EMBEDDED REGISTRATION

BACKGROUND OF THE INVENTION

1. Field of the Invention

This invention relates in general to threshold gates w/hysteresis, and more particularly to threshold gates w/hysteresis and with embedded registration.

2. Description of Related Art

Previous logic systems, such as Boolean logic systems, have employed clocking signals to regulate the digital processing of binary logic signals. Typically, a digital logic circuit will respond to multiple inputs to generate an output. As input logic signals propagate through the sequential circuit, the sequential circuit output is unreliable for a period of time corresponding to worst case propagation delays through the individual logic gates. Typically, the output signal is sampled at a time when the output is stable, often by latching the output into a register. The sampling time is set according to an independent clock signal, i.e., one that is not derived from the states of the logic gates themselves.

Threshold logic gates are one type of sequential logic circuit which respond to multiple inputs to generate an output. Generally, threshold logic gates are employed in systems where it is necessary to generate a data value or not to generate a data value dependent on whether there are at least a predetermined number of digital input signals satisfy a given threshold criteria. Threshold logic gates can be used to provide data registration.

Traditional threshold logic gates have sometimes included a registration stage having a reset capability that allows data initiation and acknowledgment processing for determining when the data should be forwarded. However, the registration stages add another stage of data processing which increases the number of active elements in the circuit as well as decrease the processing throughput.

In addition, traditional synchronous circuits have become the dominant class of logic. However, a substantial amount of design analysis is necessary to avoid a variety of timing-related problems, such as race conditions. Furthermore, the fraction of power and real estate that must be devoted to clocking has become substantial, and in certain instances has become a limiting factor to the total amount of circuitry that can be integrated onto a single chip.

It can be seen then that there is a need for a dynamic threshold gate that reduces the number of active elements required to perform the data evaluation and registration.

It can also be seen that there is a need for a dynamic threshold gate that increases the system processing throughput by pipelining the registration at the gate-level.

SUMMARY OF THE INVENTION

To overcome the limitations in the prior art described above, and to overcome other limitations that will become apparent upon reading and understanding the present specification, the present invention discloses a threshold gate w/hysteresis and embedded registration.

The present invention solves the above-described problems by providing a registration stage which is embedded in the threshold logic. Those skilled in the art will recognize that the data imputs could be inverted to function with inverted logic.

A system in accordance with the principles of the present invention includes a go-to-NULL network and a go-to-data network for receiving at least one data input having an asserted state and a NULL state, an output signal line having an asserted sate and a NULL state, a registration network, embedded in the go-to-NULL and go-to-data networks, for receiving a reset signal to initialize the register and a search/acknowledge signal to control whether the asserted state or the NULL state is desired at the output signal line and a data processing network for providing an indication of data registration as a function of the input signals at the go-to-NULL network and the go-to-data network and the reset signal and the directive signal received by the embedded registration network.

Other embodiments of a system in accordance with the principles of the invention may include alternative or optional additional aspects. One such aspect of the present invention is that the go-to-data network comprises a network of switches, the switches causing an asserted state at the output signal line when a number of the data inputs in the asserted state exceeds a predetermined threshold and the directive signal is in the asserted state.

Another aspect of the present invention is that the go-to-NULL network comprises a network of switches, the switches causing a NULL state at the output signal line when all of the data inputs are in the NULL state and the directive signal is in the NULL state.

Another aspect of the present invention is that the go-to-NULL network comprises a series chain of PMOS transistors and the go-to-data network comprises a series chain of two NMOS transistors, the go-to-NULL network being turned on when input signals to all the PMOS transistors are NULL, and the go-to-data network being turned on when a number of the input signals in the asserted state exceeds a predetermined threshold.

Still another aspect of the present invention is that the turning on of the go-to-NULL network provides a NULL state at the output signal line when the acknowledge signal is in a NULL state and the turning on of the go-to-data network provides an asserted state at the output signal line when the directive signal is in an asserted state.

Another aspect of the present invention is that a reset network is included for providing system initialization at registration boundaries.

Another aspect of the present invention is that the reset network is made transparent during normal operating conditions.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3a illustrates a symbol for a two-input, threshold-two (two-of-two) NULL convention logic gate having inputs A and B and output Z;

FIG. 3b illustrates a symbol for a three-input majority-function gate having two inputs A and B and an output Z as in FIG. 3a;

FIG. 3c illustrates a transistor-level circuit diagram of a static CMOS implementation for the NULL convention threshold gate of FIG. 3a;

FIG. 4c illustrates a transistor-level circuit diagram of a static CMOS implementation for the gate of FIG. 4a;

FIG. 5 illustrates a dynamic threshold gate;

FIG. 6 illustrates a 2-of-2 dynamic threshold gate;

FIG. 7 illustrates a 2-of-2 dynamic threshold gate, with reset to NULL;

FIG. 10 illustrates a m-of-n dynamic threshold gate with embedded registration, and with reset to NULL;

FIG. 11 illustrates a 2-of-3 threshold gate with embedded registration, and with reset to NULL;

FIG. 14 shows a table representing the results of a SPICE simulation for a 2-of-2 threshold gate which is pipelined at the gate level using both discrete and embedded registration.

DETAILED DESCRIPTION OF THE INVENTION

Figure 1:
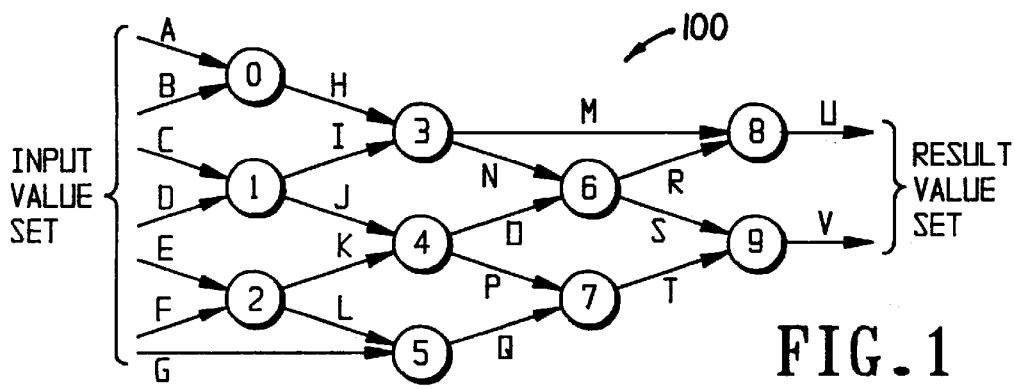
FIG. 1 illustrates a NULL convention combinational circuit.

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a dynamic threshold gate having embedded registration for reducing the number of active elements required to perform data evaluation and registration and for increasing the system processing throughput by pipelining the registration at the gate-level. In the following discussion, those skilled in the art will recognize that inputs may be inverted to provide inverse logic implementation.

A NULL convention combinational circuit generates a result value set in response to an input value set. An important aspect of NULL convention circuits is that any particular input or output may have a meaningful value or a NULL value which has no data meaning. The very presence of a non-NULL value indicates that the value has meaning, and no external clock is required to indicate that a value is meaningful. Further information regarding NULL convention logic can be found in U.S. Pat. No. 5,305,463, which is incorporated here by reference. Certain aspects are reiterated here for convenience.

NULL convention logic differs from traditional Boolean logic where each signal line may have one of two meaningful states. In traditional logic that uses CMOS or TTL implementation, a low voltage level on a signal line means "logic false" or the number "zero." A high voltage level on the same line means "logic true" or the number "one." Thus a signal line may assume one of two values, either of which may or may not be meaningful.

NULL convention has multiple implementations each of which include a NULL state which has no data meaning. In one implementation, two separate signal lines would be used in order to convey two meaningful values. For example, logic "false" could be conveyed by asserting a high voltage on the first line and a low voltage on the second line. Logic "true" could be conveyed by asserting a low voltage on the first line and a high voltage on the second line. NULL could be conveyed by low voltage levels on both lines, i.e., high voltage levels on both lines is unused. However, those skilled in the art will recognize that other equally valid expressions are possible, including the voltage conversion of each described level. In this example, meaning is expressed according to the signal line asserted, not by the choice of voltage level. A high voltage level in this case "asserts" the meaning of the line. A low voltage level in this case is meaningless with respect to data.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero voltage level is NULL (meaningless). In other implementations, parameters other than voltage may be used as long as the requisite number of states can be differentiated. Discussions here will assume an implementation in which each signal line may assume two voltage levels, with a high level asserting meaning and the ground voltage level being NULL. This provides voltage levels as concrete examples to aid in explanation, but the invention is not limited to these voltage-level examples, nor is it assumed that these are the preferred levels.

Another important aspect of NULL convention circuits is the way that meaningful and NULL signals propagate through a combinational circuit. All inputs to a NULL convention logic element must be meaningful before the element asserts a meaningful output. FIG. 1 illustrates a NULL convention combinational circuit 100. In FIG. 1, logic gates are shown as circles and labeled with numerals 0–9. Input lines are labeled with letters A–G, output lines are labeled with letters U, V, and internal connection lines are labeled with letters H–T. Signal lines are schematic, and may be individual conductors, multiple conductors or another NULL convention configuration. Each logic is assumed in this discussion to require data at both inputs before the circuit will generate data at its output.

In the NULL convention circuit 100, each logic gate transitions from a NULL to a meaningful output value after all inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero will maintain a NULL output value. In the case that only input line B transitions to a meaningful value (while input line A remains at NULL), logic gate zero still will maintain a NULL output. When both input lines A and B transition to meaningful values (either simultaneously or sequentially), then logic gate zero (0) will change its output to a meaningful value.

The characteristic described above applies to all logic gates in the sequential circuit 100. Logic gates zero through two, which are directly connected to input lines A–F, will provide meaningful values to the next level of gates (three through five) only when the respective inputs lines A–F have completely assumed meaningful values. This produces a general result that can be visualized as a wavefront of meaningful values propagating through the network. At the network output U and V, logic gates eight and nine will change their individual outputs from NULL to meaningful values only where all upstream gates have propagated meaningful values.

Two important characteristics should now be apparent. First, the network outputs transition from NULL to meaningful values cleanly. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to indicate that the network has completed its operations.

The NULL convention circuit 100 discussed here also exhibit a second characteristic; the outputs of the logic gates transition from a meaningful value to NULL only when all inputs have switched to NULL. In this way, NULL values propagate through the network cleanly, and the very presence of NULL values at the output is sufficient to indicate that all gates in the network have returned to NULL output states.

Figure 2A:
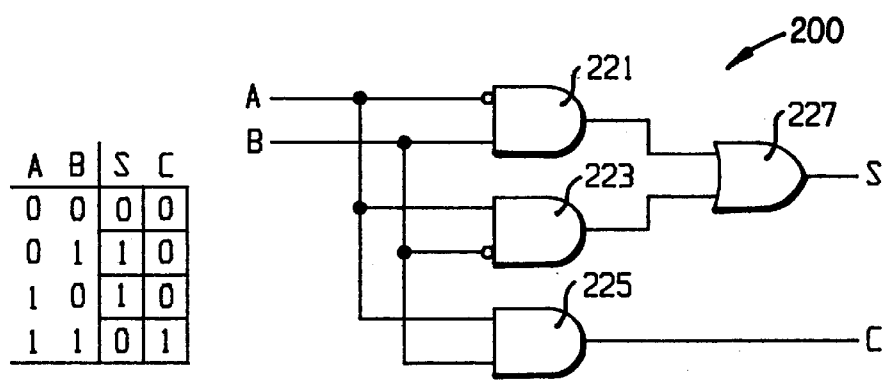
FIG. 2a illustrates a Boolean half-adder constructed of three AND gates and an OR gate.

FIG. 2a illustrates a Boolean half-adder 200 constructed of three AND gates 221, 223, 225 and an OR gate 227. The half adder has two input signal lines A and 2, and two output line S (sum) and C (carry). Each input line may assume one of two meaningful values: "zero" and "one." Each output line may assume one of two meaningful values: "zero" and "one." The half adder implements a transfer function such that:

when both inputs are zero, sum (S) and carry (C) outputs become "zero;"

when a single input is "one" (and the other is "zero"), sum becomes "one" and carry becomes "zero;" and when both inputs are "one," sum becomes "zero" and carry becomes "one."

Figure 2B:
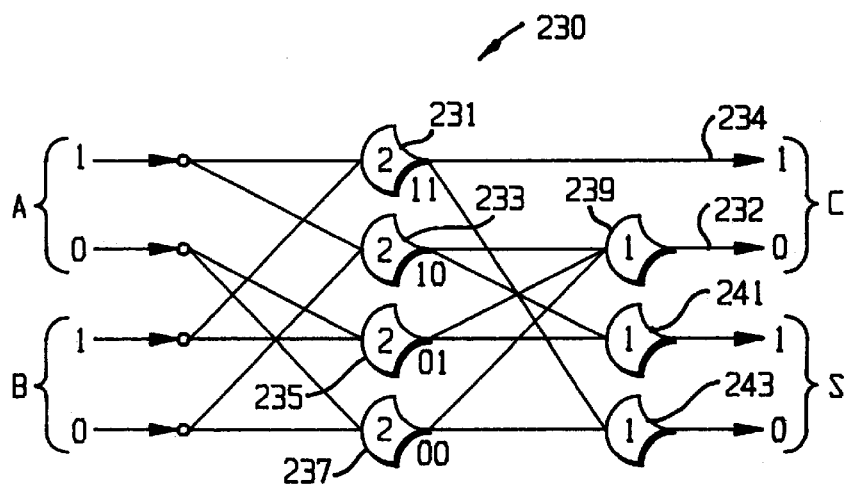
FIG. 2b illustrates a NULL convention half adder.

For comparison, FIG. 2b illustrates a NULL convention half adder 230. It is similar to the Boolean half-adder of FIG. 2a in that there are two inputs A and B and two outputs S and C, and it implements the same transfer function. Unlike the Boolean circuit 200, the NULL convention half-adder 230 has a separate signal line for each meaning. The carry output, for example, has two separate signal lines, each of which may assume one of two voltage levels. A first voltage level is meaningful and the other voltage level is NULL. In order to assert a meaning of "carry equals zero," the first signal line 232, designated as having a meaning "zero" when asserted, is driven to its meaningful voltage level, while the second signal line 234 is held at the NULL voltage level. In order to assert a value "carry equals one," the first signal line 232 is held at the NULL voltage level, while the second signal line 234, designated by design as having a meaning "one", is driven to the meaningful voltage level. The half-adder can also assert "carry has no meaning" by holding both carry signal lines at NULL. It is not defined in normal operation to have both carry lines at the meaningful voltage level. Similarly, the remaining inputs and outputs (A, B, S) each have a pair of signal lines. Each pair of lines is a "mutually exclusive assertion group," which means only one line of any group will be asserted at a time.

Hereafter, when a NULL convention circuit switches a signal line to a meaningful value, it will be said that the circuit "asserts" the line, or that the line is "asserted." When a NULL convention circuit switches a signal line to a NULL value, the line will be said to be NULL.

The two carry lines form a group in which at most one line may be asserted (i.e., assume a meaningful value). Such a group is referred to as a "mutually exclusive assertion group." In other design situations, mutually exclusive assertion groups may have more than two lines. A single line, by itself, can be considered a mutually exclusive assertion group.

Internally, the NULL convention half adder 230 is made of seven threshold gates 231, 233, 235, 237, 239, 241, 243. Each threshold gate has a single signal line output which may be asserted (assume a meaningful voltage level) or NULL (assume a NULL voltage level). The signal line may fan out to several destinations. Four of the gates 231, 233, 235, 237 have two input signal lines and a threshold of two ("threshold-two gate"). The output of a threshold-two gate is asserted when two (both) of the input lines are asserted. One of the gates 239 has three input signal lines and a threshold of one ("threshold-one gate"). The output of the threshold-one gate is asserted when any one of the three inputs is asserted. Two of the gates 241, 243 have two inputs and a threshold of one. As a drawing convention, a numeral inside a threshold gate symbol indicates the number of asserted input lines needed to cause the gate to assert its output.

Each of the NULL convention gates of the half adder 230 exhibits the characteristic that it switches to a meaningful value only when the requisite number of inputs becomes meaningful, and each threshold gate holds a meaningful output value until all of the inputs become NULL. Thus, threshold gates exhibit a hysteresis: as the number of inputs drops below the threshold, the output remains meaningful. For example, the threshold-two gates 231, 233, 235, 237 will maintain meaningful output levels when the number of meaningful inputs drops from two to one. The threshold-two gates will only switch to NULL when all inputs become NULL.

It should be appreciated that a threshold gate forms a central building block of NULL convention logic circuits. The NULL convention threshold gates may be characterized by the number of inputs and the threshold value. NULL convention threshold gates have the unique operational requirement that some or all inputs will form mutually exclusive assertion groups. They further ensure completeness of the input set, in that they switch to a NULL output only when all inputs are NULL.

FIG. 3a illustrates a threshold gate 300 wherein a symbol 352 is used to signify a two-input, threshold-two (two-of-two) NULL convention logic gate having inputs A and B and output Z. Here, each input line 351, 353 and the output line 355 each represent one signal line which is capable of assuming a meaningful value or NULL. When both input signals A and B are asserted, the output Z is asserted. After the output has been asserted, the output returns to NULL only when both inputs A and B return to NULL.

FIG. 3b illustrates a threshold gate 320 wherein a symbol 357 is used to signify a three-input majority-function gate having two inputs A and B and an output Z as in FIG. 3a. The output line 359 is fed back as an input, which conceptually provides the functionality of the two-of-two NULL convention threshold gate of FIG. 3a. In isolation (i.e., without the feedback signal), the majority-function gate operates without hysteresis. When the number of asserted inputs is greater than two, the majority function gate output is asserted. When the number of asserted inputs is less than two, the majority function gate output goes NULL.

With feedback, the majority-function gate has hysteresis. When the output Z is asserted, the feedback line provides one asserted input. If the number of asserted inputs drops to one, then the feedback line provide a second asserted input to hold the majority function gate to an asserted output. The output Z will switch to NULL only when both independent inputs A and B become NULL. Conversely, when the output Z is NULL, the feedback line provides one NULL input. The output Z will be asserted only when both independent inputs A and B are asserted.

FIG. 3c illustrates a transistor-level circuit diagram 340 of a static CMOS implementation for the NULL convention threshold gate 300 of FIG. 3a. The implementation includes a pull-up sub-circuit 361, a pull-down sub-circuit 363, and a driver 365. The input to the driver 365 is taken from a signal junction 370.

The pull-up sub-circuit 361 includes a series pair of PMOS transistors 367, 369 connecting a voltage source V to a signal junction 370. The voltage source B is also connected to the signal junction 370 through a parallel pair of PMOS transistors 371, 373, which is in series with a feedback PMOS transistor 375.

The pull-down sub-circuit 363 includes a series pair of NMOS transistors 377, 379 connecting signal junction 370 to ground. The signal junction 370 is also connected to ground through a parallel pair of NMOS transistors 381, 383, which is in series with a feedback NMOS transistor 385.

One input signal A is connected to the gates of one PMOS series transistor 367, one PMOS parallel transistor 371, one NMOS series transistor 379 and one NMOS parallel transistor 381. The other input signal B is connected to the gates of one PMOS series transistor 369, one PMOS parallel transistor 373, one NMOS series transistor 377 and one NMOS parallel transistor 383. The output Z is connected to the gates of both feedback transistors 375, 385.

Operation of the circuit will assume that NULL is a voltage at or near ground, and that asserted is at or near the voltage source V. The value for the asserted voltage may be sized for the fabrication technology.

When both input signals A, B are NULL, the PMOS series transistors 367, 369 are on, the NMOS series transistors 377, 379 are off, and the signal junction 370 is pulled to the voltage source V. The driver input (which is taken from the signal junction 370) is at the source voltage level, and the driver 365 switches its output Z to NULL. The parallel PMOS transistors 371, 373 are also on, as is the PMOS feedback transistor 375. Thus, the signal junction 370 is switched to the voltage source through the parallel PMOS transistors 371, 373 as well. All of the NMOS transistors are off.

When both input signals A, B are asserted, the NMOS series transistors 377, 379 are on, the PMOS series transistors 367, 369 are off, and the signal junction 370 is pulled to ground. The driver input is at the ground voltage, and the driver 365 asserts its output. The parallel NMOS transistors 381, 383 are also on, as is the NMOS feedback transistor 385. Thus, the signal junction 370 is switched to ground through the parallel NMOS transistors 381, 383 as well. All of-the PMOS transistors are off.

When one input signal is asserted and the other is NULL, one transistor of each series pair 367, 369, 377, 379 is on, and the other transistor is off. Thus, the series transistors do not connect the signal junction 370 either to the voltage source or to ground. But one transistor of each parallel pair 371, 373, 381, 383 is on. The voltage of the signal junction 370 (and thus of the output Z) is determined by the state of the feedback transistors 375, 385. If the prior output Z was NULL, the PMOS feedback transistor 375 is on, the signal junction 370 is at the source voltage, and the driver output remains NULL. If the prior output Z was asserted, the NMOS feedback transistor 385 is on, the signal junction 370 is at ground, and the driver output remains asserted.

Thus the series transistors 367, 369, 377, 379 determine the output state when both inputs are NULL and when both inputs are asserted. The feedback transistors 375, 385 provide the hysteresis when one input is asserted and the other input is NULL. The parallel PMOS transistors 371, 373 serve to disengage the PMOS feedback transistors when both inputs are asserted, and the parallel NMOS transistors 381, 383 serve to disengage the NMOS feedback transistors when both inputs are NULL.

Figure 4A:
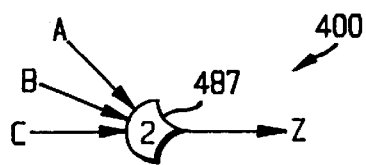
FIG. 4a illustrates a symbol for a three-input, threshold-two (two-of-three) NULL convention logic gate.
Figure 4B:
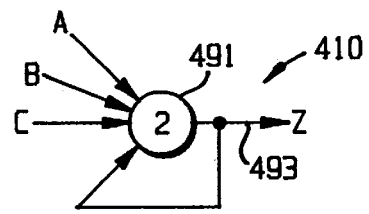
FIG. 4b illustrates a symbol for a four-input function gate (no hysteresis) with feedback.

FIG. 4a illustrates a threshold gate 400 wherein a symbol 487 is used to signify a three-input, threshold-two (two-of-three) NULL convention logic gate. The drawing conventions are the same as for FIG. 3a, but with three inputs A, B, C. When two of the three inputs are asserted, the output Z is asserted. After the output has been asserted, the output returns to NULL only when all inputs return to NULL. FIG. 4b illustrates a threshold gate 410 wherein a symbol 491 is used to signify a four-input function gate (no hysteresis) with feedback. The output line 493 is fed back as an input. In isolation, the function gate operates as a threshold-2 gate without hysteresis. The output switches high when the number of high inputs is two or greater, and the output switches low when the number of high inputs is less than two. With feedback, the output signal Z becomes an input, and the circuit has the desired hysteresis. For example, after the output has been asserted and the number of asserted inputs drops to one, the feedback line provides a second asserted input to hold the majority function gate to an asserted output. The majority function gate 91 switches to NULL when all independent inputs A, B, C, become NULL.

Another way of understanding the operation of the gate 410 of FIG. 4b is with an algebraic expression for the switching behavior. The function gate output should be asserted if any of the following conditions are true:

A and B are asserted;

A and C are asserted;

A and Z are asserted;

B and C are asserted;

B and Z are asserted;

C and Z are asserted.

This can be expressed in traditional Boolean terms as:

$$f=(A*B)+(A*C)+(A*Z)+(B*C)+(B*Z)+(C*Z)$$

where "+" is the OR operator, and where "*" is the AND operator. The equation above can be re-written as:

$$f=(A+B)*(C+Z)+(A*B)+(C*Z).$$

Similarly, the majority function gate output should be NULL when it is not asserted. Stated algebraically:

$$\overline{f} = \overline{(A+B)*(C+Z)+(A*B)+(C*Z)}$$

-continued $$= \overline{A} * \overline{B} * (\overline{C} + \overline{Z}) + \overline{C} * \overline{Z} * (\overline{A} + \overline{B})$$

Figure 4C:
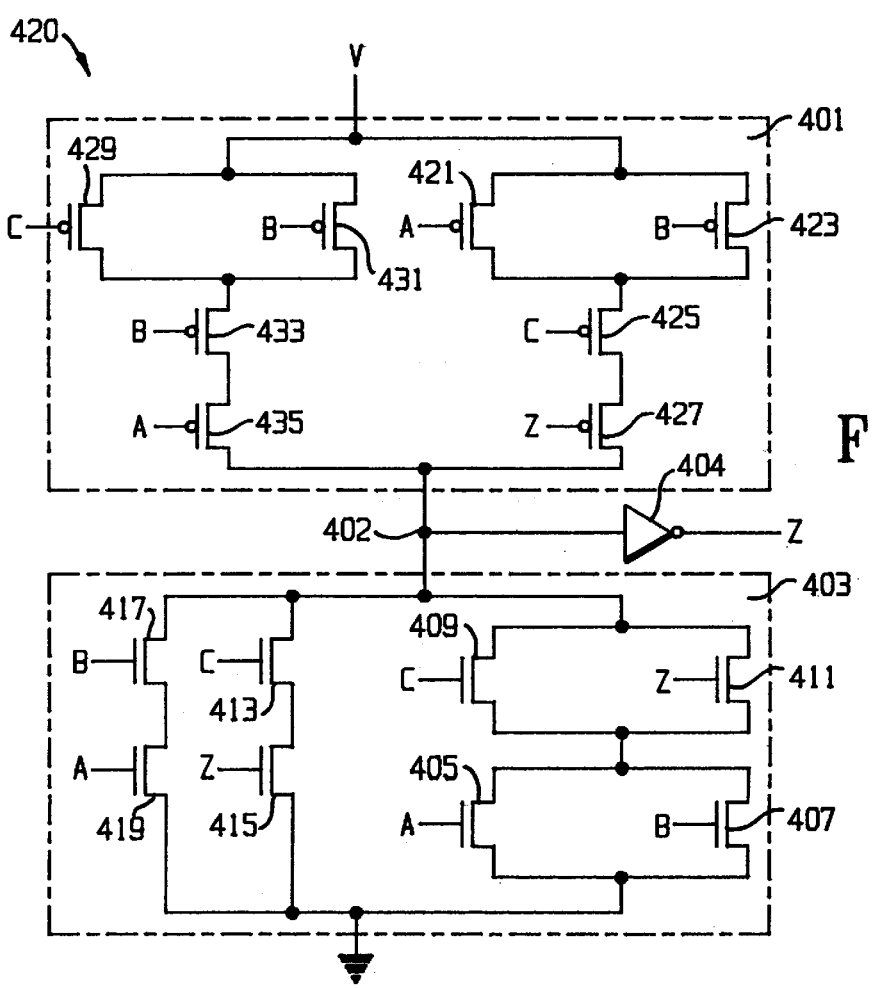

FIG. 4c illustrates a transistor-level circuit diagram 420 of a static CMOS implementation for gate 400 of FIG. 4a. The circuit 420 includes a pull-up sub-circuit 401, a pull-down subcircuit 403 and an inverting driver 404 connected at a common signal junction 402. The pull-down sub-circuit 403 implements the function for generating an asserted output, expressed above as:

$$f=(A+B)*(C+Z)+(A*B)+(C*Z)$$

where the OR function is implemented with parallel transistors, and the AND function is implemented with serial transistors. When a condition of the function is met, the pull-down circuit 403 will connect the inverting driver input to ground, which results in an asserted output.

FIG. 4c, the (A+B) term is implemented with parallel NMOS transistors 405, 407 having gates connected to input signal lines A and B, and having commonly connected sources and drains. The (C+Z) term is implemented with parallel NMOS transistors 409, 411—one having a gate connected to input signal line C, and the other having a gate connected to feedback signal line Z. The NMOS transistors 409, 411 have commonly connected sources and drains. The combined term (A+B)*(C+Z) is implemented by serially connecting the parallel transistor pairs f or (A+B) and (C+Z) between the signal junction 402 and ground.

The term (C*Z) is implemented with NMOS transistors 413, 415, with one having a gate connected to the C input signal line and the other having a gate connected to the Z feedback signal line. The NMOS transistors 413, 415 have sources and drains connected in series between the signal Junction 402 and ground.

The term (A*B) is implemented by serially connecting sources and drains of NMOS transistors 417, 419 between the signal junction 402 and ground, and by connecting the A input signal line to one gate, and the B input signal line to the other gate.

The overall function for the asserted output is implemented by parallel connection of the implementations of the three terms:

(A+B)*(C+Z), (A*B) and (C*Z)

The pull-up sub-circuit 401 is a similar implementation of the terms $\overline{A}*\overline{B}*(\overline{C}+\overline{Z})$ and $\overline{C}*\overline{Z}*(\overline{A}+\overline{B})$ discussed above. The term $(\overline{A}+\overline{B})$ is implemented through the parallel connection of two PMOS transistors 421, 423 with gates connected to the A and B inputs. The term $\overline{C}*\overline{Z}*(\overline{A}+\overline{B})$ is implemented by the series connection of the implementation for $(\overline{A}+\overline{B})$ with two additional PMOS transistors 425, 427 for the C and Z inputs.

In a similar fashion, the term $\overline{A}*\overline{B}*(\overline{C}+\overline{Z})$ is implemented by connecting two PMOS transistors 429, 431 in parallel (for C and Z inputs), and connecting this parallel arrangement in series with two additional PMOS transistors 433, 435 for the A and B inputs. The overall pull-up function is implemented by connecting implementations for individual terms in parallel between the voltage source V and the signal junction 402.

It should be apparent from the description above that a variety of transistor arrangements are possible for the two-of-three NULL convention gate by rearranging terms of the algebraic expression to an equivalent expression. It should also be apparent that a wide variety of NULL convention gates can be made with varying numbers of inputs and varying threshold levels.

To reiterate, NULL convention threshold gates respond to at least one input to generate an output as input logic signals propagate through the circuit. The multiple inputs each have an asserted state and a NULL state. NULL convention threshold gates switch an output to an asserted state when a number of asserted inputs exceeds a threshold number. NULL convention threshold gates switch an output to the NULL state only after all inputs have returned to NULL. Further information regarding NULL convention threshold gates can be found in U.S. patent application Ser. No. 08/318,510, which is incorporated here by reference. Certain aspects are reiterated here for convenience.

Threshold gates include a "go-to-NULL" network, a "go-to-data" network and an inverter. However, threshold gates can also include a reset capability. For example, registers can be created using a 2-of-2 threshold gate with a reset capability. The register gate passes the data value to be stored under the control of an acknowledge signal which tells the gate when the data should be stored. By incorporating both a reset or set and an acknowledge signal into general M-of-N (M≦N) threshold gates, a resettable register is created and embedded in the threshold function. This implies that the result of the threshold function is registered upon evaluation of the threshold function.

Dynamic threshold gates use a pull-up network, a pull-down network and an inverter to produce the correct threshold function. The general structure of a dynamic threshold gate 500 is shown in FIG. 5. As FIG. 5 shows, the dynamic threshold gate 500 includes a "go-to-NULL" (GTN) pull-up network 510, a "go-to-data" (GTD) pull-down network 520 and an inverter 530. However, those skilled in the art will recognize that other circuit elements could be used other than an inverter 530 to produce the output. For example, the "go-to-NULL" (GTN) pull-up network 510 and "go-to-data" (GTD) pull-down network 520 could be coupled to a Schmitt trigger circuit or comparator circuit to produce the needed output in response to a signal emanating from the "go-to-NULL" (GTN) pull-up network 510 and "go-to-data" (GTD) pull-down network 520.

When the GTN network 510 is turned on, Node 1 540 is connected directly to VDD 542. This causes the output 544, the output of the threshold function, to be pulled down to ground (GND) 546. When the output 544 is pulled down to GND 546, it is considered to be NULL. When the GTD network 520 is turned on, Node 1 540 is connected to GND 546 and discharged. This causes the output 544 to be pulled up to VDD 542. When the output 544 is pulled up to VDD 542, it is considered to be data. The GTN network 510 will not be turned on until a predetermined number, e.g., all, of the inputs become NULL (low-level voltage, GND), thereby providing hysteresis to the threshold function. The GTD network 520 will not be turned on until the number of signals asserting data (high-level voltage, VDD) meets or exceeds the threshold of the gate.

As an example, consider the 2-of-2 threshold gate 600 that is shown in FIG. 6. The gate 600 has two inputs, A 610, 612 and B 620, 622, and one output, Z 630. The GTN network 640 includes a series chain of two PMOS transistors 610, 620, while the GTD network 650 includes a series chain of two NMOS transistors 612, 622. The GTN network 640 will be turned on when both A 610 and B 620 are NULL. This causes the output 630 to become NULL. The GTD network 650 will be turned on when both A 612 and B 622 are data. This causes the output 630 to become data.

Figure 8:
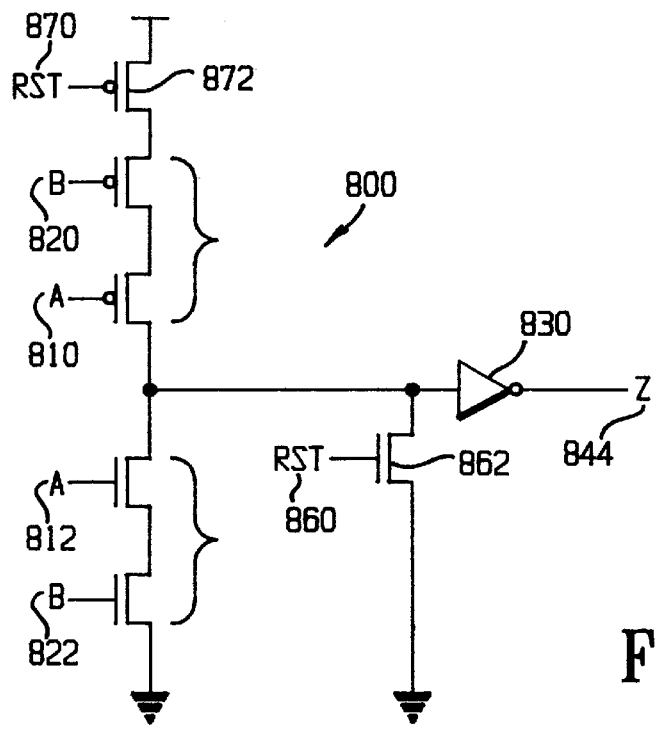
FIG. 8 illustrates a 2-of-2 dynamic threshold gate, with reset to data.

Accordingly, a register can be created using a 2-of-2 threshold gate with a re-settable output. FIGS. 7 and 8 show 2-of-2 threshold gates which can be reset to an initial logic value of NULL 700 or data 800, respectively. The 2-of-2 threshold gate 700 of FIG. 7 will have its output 744 reset to NULL when the -RST 760 is low (low-level voltage, GND) via the PMOS transistor 762. The -RST NMOS transistor 772 eliminates a possible short from VDD to GND in the event that the inputs A 710, 712 and B 720, 722 are all high (high-level voltage, VDD) at any time during the reset period.

The 2-of-2 threshold gate 800 shown in FIG. 8 will have its output 844 reset to data when the RST 860 is high via the NMOS transistor 862. The RST PMOS transistor 872 eliminates a possible short from VDD to GND in the event that the inputs A 810, 812 and B 820, 822 are all low at any time during the reset period. The reset capability allows for system initialization at registration boundaries and serves no other functional purpose. During normal operating conditions (reset is not asserted), the transistors used to prevent the short-circuit condition upon reset are turned on, allowing them to become effectively transparent.

Figure 9:
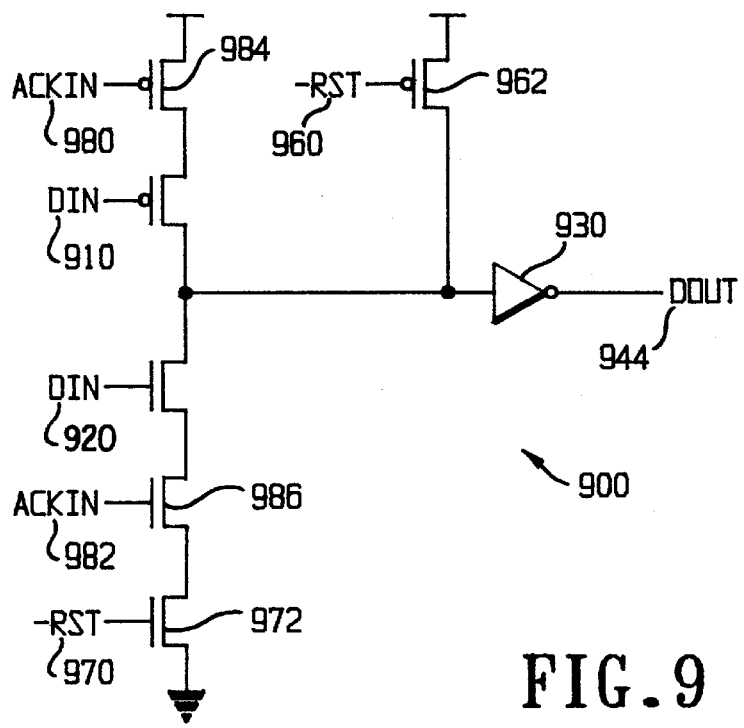
FIG. 9 illustrates a 1-of-1 threshold gate with data registration, and with reset to NULL.

A 2-of-2 threshold gate with reset capability functions in the same manner as the 2-of-2 threshold gate 600 shown in FIG. 6. The only difference between an 2-of-2 threshold gate used for data evaluation and a 2-of-2 threshold gate used for data registration is the signals which are passed to the threshold gate. When a 2-of-2 threshold gate is used for data evaluation, two data values, A and B, are passed to the gate as inputs. The output will be NULL when both A and B are NULL. The output will be data when both A and B are data. When a 2-of-2 threshold gate is used for data registration, a single data value and an acknowledge signal are passed to the gate as inputs. FIG. 9 shows a 1-of-1 threshold gate 900 with reset capabilities that has its inputs configured for data registration.

In FIG. 9, the acknowledge signal ACKIN 980, 982, acts as a gatekeeper which allows the DIN 910, 920 to be passed for storage. The ACKIN signal 980, 982 provides the current registration stage with information concerning the current state of the next registration stage. The ACKIN signal 980, 982 tells the current registration state whether or not the next registration stage has resolved its current computation. When ACKIN 980, 982 is high, it is referred to as a "request-for-data" (RFD). If ACKIN 980, 982 asserts a RFD and DIN 910, 920 is data, DIN 910, 920 is stored at the output 944 of the threshold gate 900. When ACKIN 980, 982 is low, it is referred to as a "request-for-NULL" (RFN). If ACKIN 980. 982 asserts a RFN and DIN 910, 920 is NULL, a NULL is stored at the output 944 of the threshold gate 900.

The process of creating data registration gates can be extended to all M-of-N (M≦N) threshold gates by including a reset signal and an acknowledge signal as inputs to the threshold function. FIG. 10 shows a general M-of-N (M≦N) dynamic threshold gate 1000 with the additional transistors 1062, 1072, 1084, 1086 required to provide the reset 1060, 1070 and acknowledge 1080, 1082 signals. The threshold gate 1000 works in the same manner as previously described in FIG. 5, with the exception that one of the ACKIN transistors 1084, 1086 of either network (pull-up or pull-down) must be turned on before their respective threshold function can evaluate.

For instance, Node 1 1001 is pulled to VDD 1050 when the GTN network 1010 is turned on and ACKIN 1084, 1086 asserts a RFN. By including these four additional transistors 1062, 1072, 1084, 1086 in the threshold function implementation, a register is embedded into the threshold function of the threshold gate 1000. It should be noted that the reset capability 1060, 1070 is again used for system initialization at the registration boundaries.

As an example, consider the 2-of-3 threshold gate with an embedded register 1100, that is shown in FIG. 11. The GTN network 1110 will not be turned on until all of the inputs 1112, 1114, 1116 become NULL (low-level voltage, GND). The GTD network 1120 will not be turned on until the number of inputs 1112, 1114, 1116 asserting data (high-level voltage, VDD) meets or exceeds the threshold of the gate, i.e., 2. When A 1112, B 1114 and C 1116 are NULL and ACKIN 1180, 1182 assert a RFN, Node 1 1101 is pulled to VDD 1150 causing the output 1144 to become NULL. When any two of the three inputs A 1112, B 1114 and C 1116 are data and ACKIN 1180, 1182 asserts a RFD, Node 1 1101 is discharged to GND causing the output 1144 to become data.

The advantages of embedded registration are twofold:

the incorporation of a data evaluation gate and a data registration gate into a single gate reduces the number of transistors required to perform the data evaluation and registration; and the processing throughput of some systems can be significantly increased because the system can be effectively pipelined at a gate-level.

Figure 12:
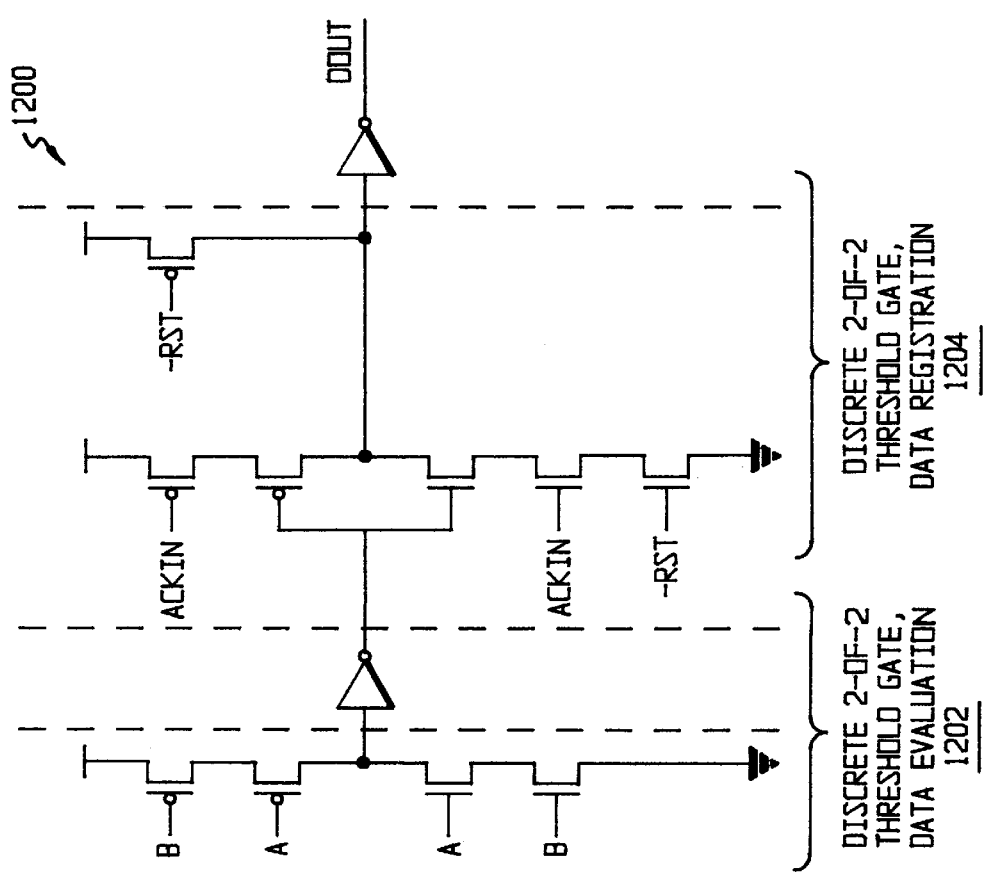
FIG. 12 illustrates a 2-of-2 threshold gate with registration, discrete gate implementation.

In order to clearly see these advantages, consider an example which requires the data registration of the output of a 2-of-2 threshold gate. FIG. 12 illustrates a discrete evaluation/registration circuit 1200. In FIG. 12, a 2-of-2 threshold gate for the data evaluation 1202 and another 2-of-2 threshold gate for the data registration 1204 are used. This implementation requires a total of 14 transistors to evaluate the threshold function and store the result.

Figure 13:
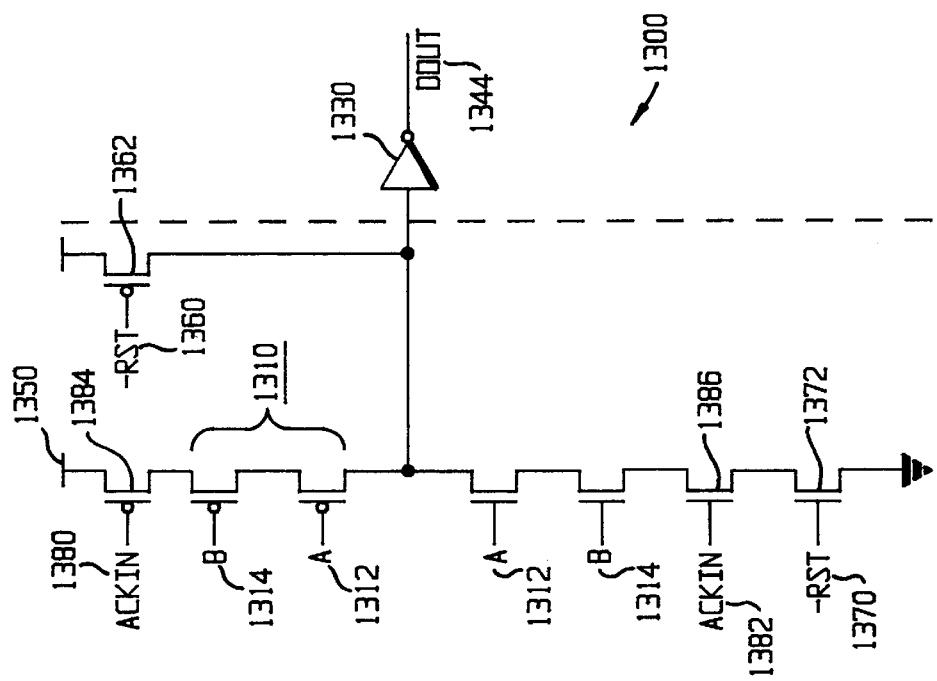
FIG. 13 illustrates a 2-of-2 threshold gate with registration, embedded register implementation.

FIG. 13 shows a 2-of-2 threshold gate with an embedded register 1300 providing the same functionality of the discrete circuit of FIG. 12. However, this embedded registration implementation requires only ten transistors to evaluate the threshold function and store the result. In FIG. 13, one of the ACKIN transistors 1384, 1386 of either network (pull-up or pull-down) must be turned on before the threshold function can evaluate. For instance, Node 1 1301 is pulled to VDD 1350 when the GTN network 1310 is turned on and ACKIN 1380, 1382 asserts a RFN. By including these four additional transistors 1362, 1372, 1384, 1386 in the threshold function implementation, a register is embedded into the threshold function. The reset capability 1360, 1370 is again used for system initialization at the registration boundaries.

Clearly both examples are pipelined at the gate-level assuming A 1312 and B 1314 arrive from a previous registration stage. However, the embedded registration reduces the cost of pipelining at a gate-level. Therefore, significant throughput increases can be achieved from gate-level pipelining without incurring an intolerable increase in the area of a system implementation. Furthermore, even though both implementations are pipelined at a gate-level, the embedded register implementation is inherently faster because the data propagation path has two levels of logic compared to the four levels of logic that must be traversed in the discrete gate implementation. FIG. 14 shows a table 1400 representing the results of a SPICE simulation for a 2-of-2 threshold gate which is pipelined at the gate level using both discrete 1310 and embedded 1312 registration. The test circuit that was used for the simulation included three stages: a registration stage, a 2-of-2 threshold stage and a registration stage. The 2-of-2 threshold gate was placed between the two registration stages.

In the discrete case, three discrete stages were used while in the embedded case the 2-of-2 threshold stage and the second registration stage were combined. The simulation shows that the embedded register provides a processing throughput improvement of almost 15 percent in the example considered.

In summary, the present invention provides a threshold gate having embedded registration for reducing the number of active elements required to perform data evaluation and registration and for increasing the system processing throughput by pipelining the registration at the gate-level. While the particular examples of the present invention herein have assumed implementations of dynamic threshold gates with embedded registration, those skilled in the art will readily recognize that threshold gates with embedded registration according to the present invention could be implemented with static or semi-static circuit designs.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A threshold register with hysteresis behavior, comprising:
   a data threshold circuit for generating an output data signal based upon an evaluation of at least one data input value and for generating an output NULL signal based upon all input signals being NULL; and
   a registration circuit, embedded in the data threshold circuit, for performing data registration, the registration circuit comprising a reset network for receiving a reset signal and an acknowledge network for receiving an acknowledge signal, the reset signal initializing the register at registration boundaries and the acknowledge signal acting as a gate-keeper for passing the evaluation of at least one data input value to an output signal line.

2. The threshold register of claim 1 wherein the data threshold circuit further comprises:
   a go-to-NULL network for receiving the at least one data input, the data input having an asserted state and a NULL state; and
   a go-to-data network for receiving the at least one data input.

3. The threshold register of claim 2 wherein the go-to-data network comprises a network of switches, the switches causing an asserted state at the output signal line when a number of the data inputs in the asserted state exceeds a predetermined threshold and the acknowledge signal is in the asserted state and the reset signal is in the inactive state.

4. The threshold register of claim 2 wherein the go-to-NULL network comprises a network of switches, the switches causing a NULL state at the output signal line when all of the data inputs are in the NULL state and the acknowledge signal is in the NULL state and the reset signal is in the inactive state.

5. The threshold register of claim 4 wherein the go-to-data network comprises a network of switches, the switches causing an asserted state at the output signal line when a number of the data inputs in the asserted state exceeds a predetermined threshold and the acknowledge signal is in the asserted state and the reset signal is in the inactive state.

6. The threshold register of claim 5 wherein the go-to-NULL network comprises a series chain of PMOS transistors and the go-to-data network comprises a circuit of NMOS transistors, the go-to-NULL network being turned on when input signals to all the PMOS transistors are NULL, and the go-to-data network being turned on when a number of the input signals in the asserted state exceeds a predetermined threshold.

7. The threshold register of claim 5 wherein the turning on of the go-to-NULL network provides a NULL state at the output signal line when the acknowledge signal is in a NULL state and the turning on of the go-to-data network provides an asserted state at the output signal line when the acknowledge signal is in an asserted state.

8. The threshold register of claim 1 wherein the reset network causes a NULL at the output signal line when the reset signal is a NULL state.

9. The threshold register of claim 1 wherein the reset network causes the output signal line to be reset to data when the reset signal is an asserted state.

10. The threshold register of claim 1 wherein the reset network is made transparent during normal operating conditions.

11. A threshold register, comprising:
    a go-to-NULL network for receiving at least one data input, the data input having an asserted state and a NULL state;
    a go-to-data network for receiving the at least one data input;
    an output signal line having an asserted sate and a NULL state;
    a registration network embedded in the go-to-NULL and go-to-data networks for receiving a reset signal and a directive signal, the reset signal initializing the register and the directive signal indicating whether the asserted state or the NULL state is desired at the output signal line; and
    a data processing network coupled to the go-to-NULL network, the go-to-data network, and the registration network, for providing an indication of data registration as a function of the input signals at the go-to-NULL network and the go-to-data network and the reset signal and the directive signal received by the embedded registration network.

12. The threshold register of claim 11 wherein the go-to-data network comprises a network of switches, the switches causing an asserted state at the output signal line when a number of the data inputs in the asserted state exceeds a predetermined threshold and the reset signal and the directive signal are in the asserted state.

13. The threshold register of claim 11 wherein the go-to-NULL network comprises a network of switches, the switches causing a NULL state at the output signal line when all of the data inputs are in the NULL state and the directive signal is in the NULL state.

14. The threshold register of claim 13 wherein the go-to-data network comprises a network of switches, the switches causing an asserted state at the output signal line when a number of the data inputs in the asserted state exceeds a predetermined threshold and reset signal and the directive signal are in the asserted state.

15. The threshold register of claim 14 wherein the go-to-NULL network comprises a series chain of PMOS transistors and the go-to-data network comprises a circuit of NMOS transistors, the go-to-NULL network being turned on when input signals to all the PMOS transistors are NULL, and the go-to-data network being turned on when a number of the input signals in the asserted state exceeds a predetermined threshold.

16. The threshold register of claim 14 wherein the turning on of the go-to-NULL network provides a NULL state at the output signal line when the acknowledge signal is in a NULL state and the turning on of the go-to-data network provides an asserted state at the output signal line when the directive signal is in an asserted state.

17. The threshold register of claim 11 wherein the registration network causes a NULL at the output signal line when the reset signal is a NULL state.

18. The threshold register of claim 11 wherein the registration network causes the output signal line to be reset to data when the reset signal is an asserted state.

19. A threshold register, comprising:
- a plurality M of input signal lines, each line having an asserted state and a NULL state;
- a registration network for determining a current state of a next register based upon an acknowledgment signal received from the next register and a reset signal, the acknowledgment signal and the reset signal having an asserted state and a NULL state;
- an output signal line having an asserted sate and a NULL state; and
- a hysteresis circuit switching the output signal line from the NULL state to the asserted state when a threshold number N of input signal lines change from the NULL sate to the asserted state and the acknowledgment signal indicates an asserted state, N being less than or equal to M, and holding the output signal line in an asserted state until P input signal lines return to NULL and the acknowledgment signal indicates a NULL state, P being in the range from zero to N.

20. The threshold register of claim 19 wherein the hysteresis circuit comprises:
- a driver generating an asserted state at the output signal line when a signal node is in a first state, and generating a NULL state at the output signal line when the signal node is in a second state;
- a first circuit pulling the signal node to the first state when a combination of N input signal lines are asserted and the directive signal is asserted, and holding the signal node in the first state so that the output signal line is held in the asserted state while at least P-1 input signal lines are asserted; and
- a second circuit pulling the signal node to the second state when P input lines are in the NULL state and the directive signal is in the NULL state.

21. The threshold register of claim 19 wherein the hysteresis circuit comprises:
- a Schmitt trigger generating an output at the output signal line;
- a first circuit pulling the Schmitt trigger input to a first state that triggers the Schmitt trigger to generate a NULL at the output signal line when P input lines are in the NULL state and the directive signal is in the NULL state;
- a second circuit pulling the Schmitt trigger input to a second state that triggers the Schmitt trigger to generate an asserted state at the output signal line when a combination of N input signal lines are asserted and the directive signal is asserted, and holding the Schmitt trigger input in the second state so that the output signal line is held in the asserted state while at least P-1 input signal lines are asserted.

22. The threshold register of claim 19 wherein the go-to-data network comprises a network of switches, the switches causing an asserted state at the output signal line when a number of the data inputs in the asserted state exceeds a predetermined threshold and the reset signal and the directive signal are in the asserted state.

23. The threshold register of claim 19 wherein the go-to-NULL network comprises a network of switches, the switches causing a NULL state at the output signal line when all of the data inputs are in the NULL state and the directive signal is in the NULL state.

24. The threshold register of claim 23 wherein the go-to-data network comprises a network of switches, the switches causing an asserted state at the output signal line when a number of the data inputs in the asserted state exceeds a predetermined threshold and the reset signal and the directive signal are in the asserted state.

25. The threshold register of claim 24 wherein the go-to-NULL network comprises a series chain of PMOS transistors and the go-to-data network comprises a circuit of NMOS transistors, the go-to-NULL network being turned on when input signals to all the PMOS transistors are NULL, and the go-to-data network being turned on when a number of the input signals in the asserted state exceeds a predetermined threshold.

26. The threshold register of claim 24 wherein the turning on of the go-to-NULL network provides a NULL state at the output signal line when the acknowledge signal is in a NULL state and the turning on of the go-to-data network provides an asserted state at the output signal line when the directive signal is in an asserted state.

27. The threshold register of claim 19 wherein the registration network causes a NULL at the output signal line when the reset signal is a NULL state.

28. The threshold register of claim 19 wherein the registration network causes the output signal line to be reset to data when the reset signal is an asserted state.

* * * * *